(12) United States Patent
Chatterjee et al.

(10) Patent No.: US 7,045,436 B2
(45) Date of Patent: May 16, 2006

(54) METHOD TO ENGINEER THE INVERSE NARROW WIDTH EFFECT (INWE) IN CMOS TECHNOLOGY USING SHALLOW TRENCH ISOLATION (STI)

(75) Inventors: Amitava Chatterjee, Plano, TX (US); Alwin Tsao, Garland, TX (US); Manuel Quevedo-Lopez, Plano, TX (US); Jong Yoon, Plano, TX (US); Shaoping Tang, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/899,664

(22) Filed: Jul. 27, 2004

(65) Prior Publication Data

US 2006/0024910 A1 Feb. 2, 2006

(51) Int. Cl.
*H01L 21/762* (2006.01)

(52) U.S. Cl. .................. 438/433; 438/524; 438/525; 438/221

(58) Field of Classification Search ............... 438/433, 438/524, 525, FOR. 227, 221
See application file for complete search history.

(56) References Cited

U.S. PATENT DOCUMENTS

| 4,466,178 | A | * | 8/1984 | Soclof ..................... 438/337 |
| 4,653,177 | A | * | 3/1987 | Lebowitz et al. ........... 438/433 |
| 5,643,822 | A | * | 7/1997 | Furukawa et al. .......... 438/421 |
| 5,719,085 | A |   | 2/1998 | Moon et al. |
| 5,807,789 | A |   | 9/1998 | Chen et al. |
| 5,863,827 | A |   | 1/1999 | Joyner |
| 5,937,309 | A |   | 8/1999 | Chuang |
| 5,956,598 | A |   | 9/1999 | Huang et al. |
| 5,960,276 | A |   | 9/1999 | Liaw et al. |
| 6,040,232 | A |   | 3/2000 | Gau |
| 6,180,490 | B1 |   | 1/2001 | Vassiliev et al. |
| 6,225,187 | B1 |   | 5/2001 | Huang et al. |
| 6,245,639 | B1 |   | 6/2001 | Tsai et al. |
| 6,524,930 | B1 |   | 2/2003 | Wasshuber et al. |
| 6,562,675 | B1 |   | 5/2003 | Watt |
| 6,576,558 | B1 |   | 6/2003 | Lin et al. |
| 6,649,461 | B1 |   | 11/2003 | Lai et al. |
| 6,667,224 | B1 |   | 12/2003 | Watt et al. |
| 6,717,231 | B1 |   | 4/2004 | Kim et al. |
| 6,740,944 | B1 |   | 5/2004 | McElheny et al. |
| 2001/0029083 | A1 | * | 10/2001 | Chuang et al. ............. 438/424 |
| 2002/0031906 | A1 | * | 3/2002 | Jiang et al. ................. 438/622 |
| 2002/0048913 | A1 | * | 4/2002 | Finney ....................... 438/524 |

(Continued)

OTHER PUBLICATIONS

U.S. Appl. No. 10/899,663, filed Jul. 27, 2004, Mehrotra et al., Entire Document.

(Continued)

*Primary Examiner*—George Fourson
(74) *Attorney, Agent, or Firm*—Peter K. McLarty; W. James Brady, III; Frederick J. Telecky, Jr.

(57) ABSTRACT

A method (200) of forming an isolation structure is disclosed, and includes forming an isolation trench in a semiconductor body (214) associated with an isolation region, and filling a bottom portion of the isolation trench with an implant masking material (216). An angled ion implant is performed into the isolation trench (218) after having the bottom portion thereof filled with the implant masking material, thereby forming a threshold voltage compensation region in the semiconductor body. Subsequently, the isolation trench is filled with a dielectric material (220).

22 Claims, 10 Drawing Sheets

U.S. PATENT DOCUMENTS

2002/0182826 A1*  12/2002  Cheng et al. ............... 438/433
2003/0143812 A1*   7/2003  Lin ........................... 438/296
2003/0181004 A1    9/2003  Watt
2005/0012173 A1*   1/2005  Sheu et al. ................ 257/519

OTHER PUBLICATIONS

U.S. Appl. No. 10/899,844, filed Jul. 27, 2004, Mehrad et al., Entire Document.

* cited by examiner

METHOD TO ENGINEER THE INVERSE NARROW WIDTH EFFECT (INWE) IN CMOS TECHNOLOGY USING SHALLOW TRENCH ISOLATION (STI)

FIELD OF INVENTION

The present invention relates generally to semiconductor devices and more particularly to methods for forming shallow trench isolation structures in the manufacture of semiconductor devices.

BACKGROUND OF THE INVENTION

In the area of semiconductor device fabrication, the MOS transistor is a basic building block, wherein the transistor can be controlled to operate either in a digital or analog manner. In the fabrication of MOS transistors, source and drain regions are doped oppositely to that of a body region in a semiconductor substrate. For example, as illustrated in prior art FIG. 1, source/drain regions 12 are formed in a semiconductor body 14 of a MOS transistor, wherein the source/drain regions 12 are an n-type material and the body region 14 is a p-type material (an NMOS transistor). A gate structure 16, for example, a polysilicon gate electrode 18 overlying a gate dielectric 20, overlies a channel region 22 of the semiconductor body. Sidewall spacers 24 reside on lateral edges of the gate structure 16 to facilitate the spacing of extension regions 26 associated with the source/drains 12. Based on the gate structure 16, a distance between the source/drain regions 12 is defined, which is often referred to as a channel length "L", while a depth of the transistor, or extent in which the transistor extends transverse to the channel, is often referred to as a width "W" of the device. The width-to-length ratio (W/L) is a factor that substantially influences the drive current of the device, as well as other device performance characteristics.

As transistor devices constantly get scaled down to improve device density, both the width "W" and the channel length "L" dimensions are reduced, giving rise to various fabrication and device performance issues. One problem associated with a reduction in the transistor width "W" is experienced when shallow trench isolation (STI) is employed for device isolation, and that problem is sometimes referred to as the inverse narrow width effect (INWE). The mechanisms by which the INWE arises are not fully understood, however, various hypotheses exist. For example, it is postulated that the INWE is related to fields generated by transistors that are concentrated at sharp corners between the semiconductor body and the trench isolation structures. In addition, or alternatively, the INWE may be influenced by the diffusion of dopant atoms from the semiconductor body into the isolation structures, thereby reducing the dopant concentration of the channel dopant regions of the transistor near the STI structure.

Referring to prior art FIG. 2, a portion of a partially fabricated semiconductor device is illustrated, wherein a plurality of isolation structures 30, or STI trenches, are formed in the semiconductor body 14, thereby separating the body into isolation regions 32 and active areas 34, respectively. Subsequently, transistor devices such as MOS transistors are formed in the active areas 34, wherein a width dimension "W" of the MOS transistors extends between the isolation structures 30 as illustrated. As MOS transistor scaling continues, the distance "W" between the isolation structures decreases.

As illustrated in prior art FIG. 3, after source/drain regions and a gate electrode 18 are formed in the active areas, portions 40 of the active regions that underlie the gate 18 in the channel 22 near the STI trenches 30 will tend to suffer from the INWE. In such instances, when the gate is biased, the field lines that form at the overlapping gate electrode 18 are focused by the edge geometry of the channel, and therefore at the edges of the channel, and an inversion layer is formed at lower voltages than at the center portion of the device in the middle of the active area. Consequently, less bias is needed for application to the gate to invert the channel across its full width, thereby lowering the threshold voltage of the device. With a decrease in threshold voltage, sub-threshold leakage may undesirably increase. At large transistor widths "W" the above effect does not greatly influence the device performance, however, as "W" continues to scale downward, the impact of INWE is greater. For example, as illustrated in prior art FIGS. 4 and 5, a plan view of two portions of a MOS transistor are provided, wherein the two devices have differing transistors widths. For example, in prior art FIG. 4, an active area 50 is defined between two laterally extending STI isolation regions 52. A conductive gate electrode 54 extends vertically across the active area between the two isolation regions 52, thereby defining a channel region 56 thereunder in the active area. Due to the INWE, a region 58 exists under the channel near the STI that contributes to a reduced device threshold voltage. For a device width W1, the net impact of the region 58 due to the INWE is relatively insignificant, however, as illustrated in prior art FIG. 5, for smaller transistor widths W2, the INWE will have a substantially greater impact on the resulting device performance.

Therefore there remains a need in the art for improved STI processes and techniques that reduce or alter the impact of the INWE in order to reduce or mitigate the device performance problems associated therewith.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to the more detailed description that is presented later.

The invention provides methods for forming isolation structures and STI trenches in a semiconductor device, which may be carried out in a variety of semiconductor manufacturing processes. According to one aspect of the present invention, a method of forming an isolation structure is provided wherein an isolation hard mask is formed over a semiconductor body and patterned to define an isolation region. An isolation trench is formed in the semiconductor body using the isolation hard mask. A bottom portion of the isolation trench is then filled with an implant masking material. Subsequently, an angled implant is performed, wherein the implant masking material blocks dopant from entering the semiconductor body near a bottom and bottom sidewall portion of the trench. Consequently, the angled implant results in a voltage threshold compensation region along a top portion of the isolation trench sidewall. After the angled implant, the isolation trench is filled with a dielectric material.

According to another aspect of the present invention, the implant masking material comprises an oxide deposited in the trench using a high-density plasma oxide deposition process. In such a process, a sputtering component thereof prevents oxide from forming along sidewalls of the trench at the same rate as at the bottom thereof. Consequently, the oxide fills the trench substantially from the bottom, and after the partial filling of the trench a thickness of oxide on the upper trench sidewalls is relatively thin. Therefore when the angled implant is performed, the oxide blocks dopant from entering the semiconductor body along the bottom and bottom sidewalls of the trench. Instead the dopant enters the semiconductor body along upper sidewalls of the trench, resulting in threshold voltage compensation regions thereat.

In another aspect of the invention, the implant masking material comprises an oxide, wherein the isolation trench is filled with the oxide, followed by an etch-back process. The etch-back process removes oxide from a top portion of the trench while leaving oxide at the trench bottom. When the angled implant is performed, the remaining oxide in the trench blocks dopant from reaching the semiconductor body at the bottom and bottom sidewall portions of the trench. Since the trench is only partially filled with the oxide, dopant from the angled implant does enter the semiconductor body along a top sidewall portion of the isolation trench. After the angled implant, the remaining portion of the trench is filled with oxide.

In yet another aspect of the present invention, the implant masking material comprises an organic BARC material that is permitted to flow into the trench and fill a bottom portion thereof. After a bake of the BARC, an angled implant is performed, wherein the BARC blocks dopant from reaching the semiconductor body along the bottom and bottom sidewall portions of the trench. Since the top portion of the trench is not filled with the BARC, the angled implant results in a threshold voltage compensation region forming along a top sidewall portion of the trench in the semiconductor body. After the angled implant, the organic BARC material is removed from the bottom portion of the trench, for example, using a wet etch process. The isolation trench is then filled with a dielectric material to complete the isolation structure.

In still another aspect of the invention, the organic BARC or other implant masking material is deposited to substantially fill the trench, followed by a bake and an etch-back process that removes a portion of the material from a top portion of the trench, leaving such material in the trench bottom. An angled implant is then performed, after which the material is removed from the bottom of the trench, and a dielectric material is then formed in the trench.

The angled implant forms threshold voltage compensation regions near top sidewall portions of the isolation structures that act to alter a threshold voltage of transistor devices, particularly narrow width devices, in both NMOS and PMOS regions. Based on the type of dopant employed, and an implant dose (as well as other factors), an imbalance between PMOS and NMOS device threshold voltages can be reduced or increased. In either case, the present invention provides a control knob for adjusting device threshold voltages without requiring an additional mask.

To the accomplishment of the foregoing and related ends, the following description and annexed drawings set forth in detail certain illustrative aspects and implementations of the invention. These are indicative of but a few of the various ways in which the principles of the invention may be employed. Other aspects, advantages and novel features of the invention will become apparent from the following detailed description of the invention when considered in conjunction with the drawings.

DETAILED DESCRIPTION OF THE INVENTION

Figure 1:
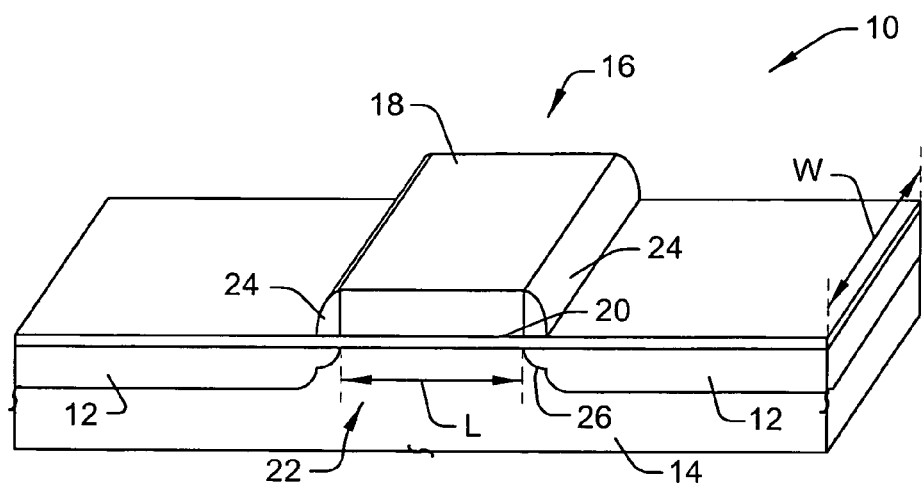
FIG. 1 is a prior art fragmentary perspective view of a MOS transistor.
Figure 2:
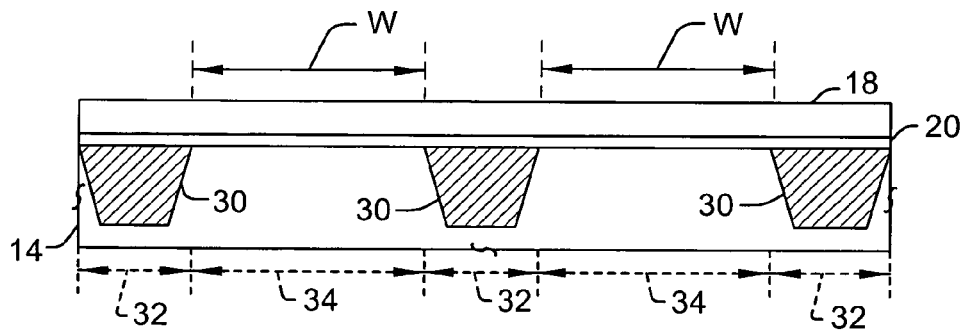
FIGS. 2 and 3 are prior art partial side elevation views in section illustrating a portion of a MOS transistor in various points in a manufacturing process that experiences the inverse narrow width effect (INWE)
Figure 3:
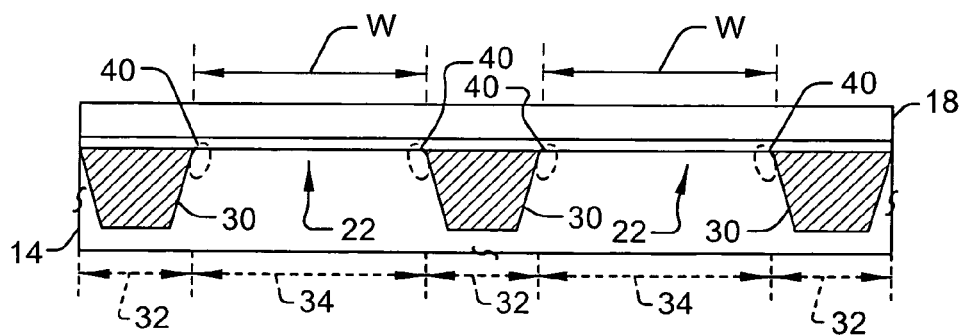
Figure 4:
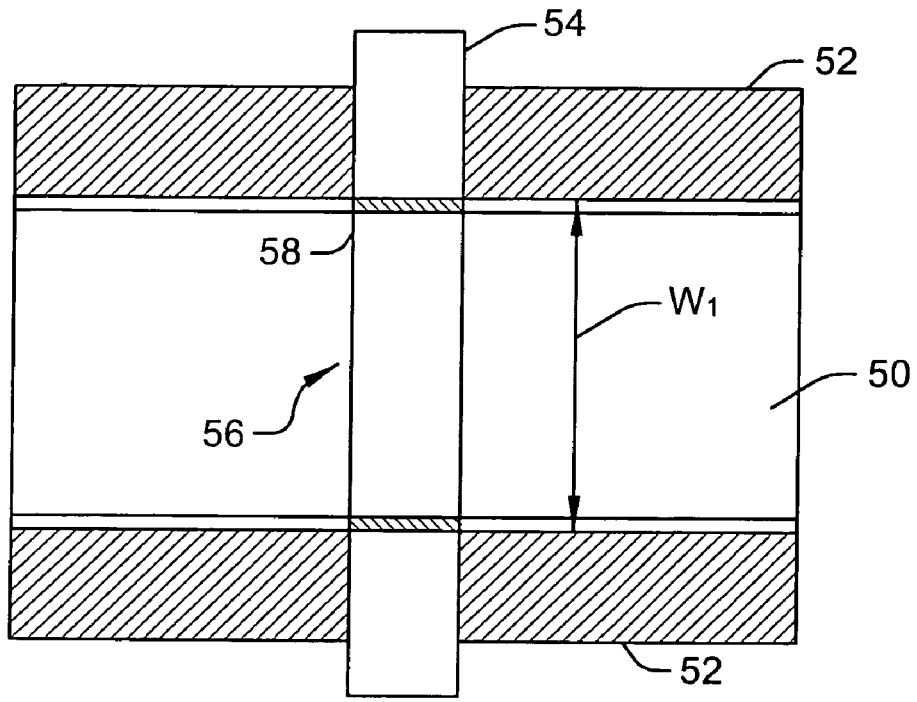
FIGS. 4 and 5 are prior art partial side elevation views in section illustrating a MOS transistor and how, as a transistor dimension decreases in a width direction, the INWE becomes more pronounced.
Figure 5:
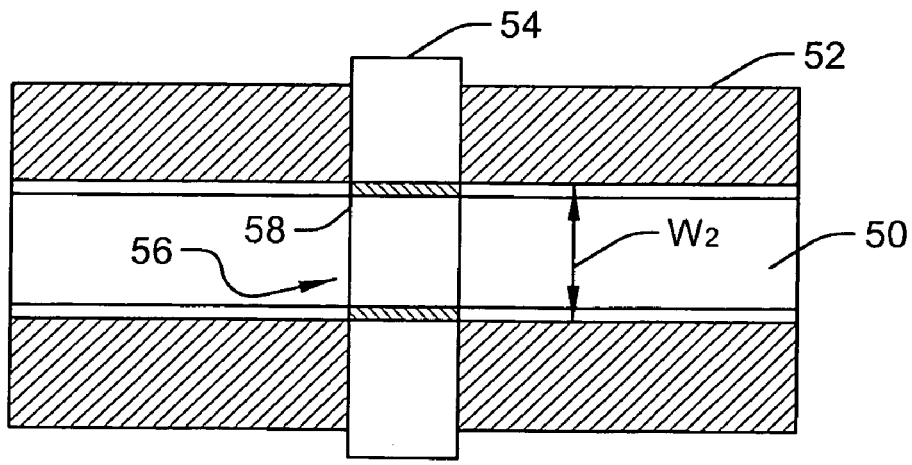
Figure 6:
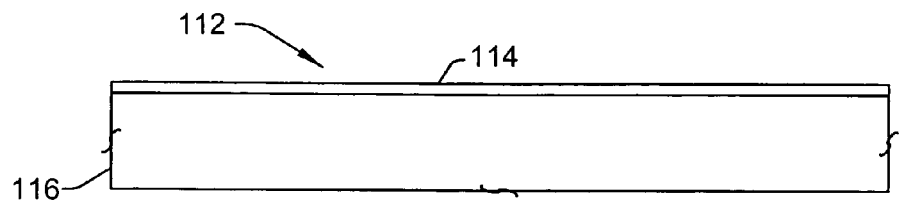
FIGS. 6–12 are prior art partial side elevation views in section illustrating a conventional shallow trench isolation process for providing isolation between active areas in a semiconductor device.
Figure 7:
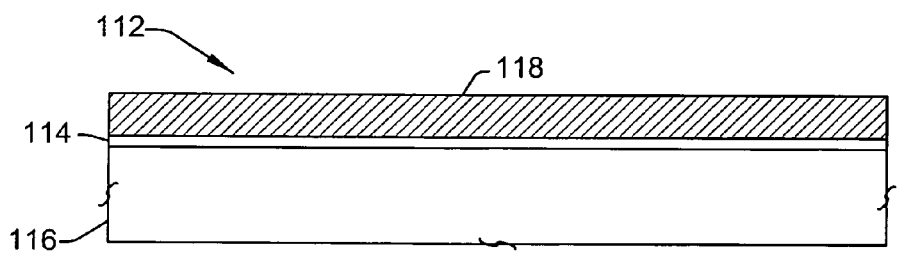
Figure 8A:
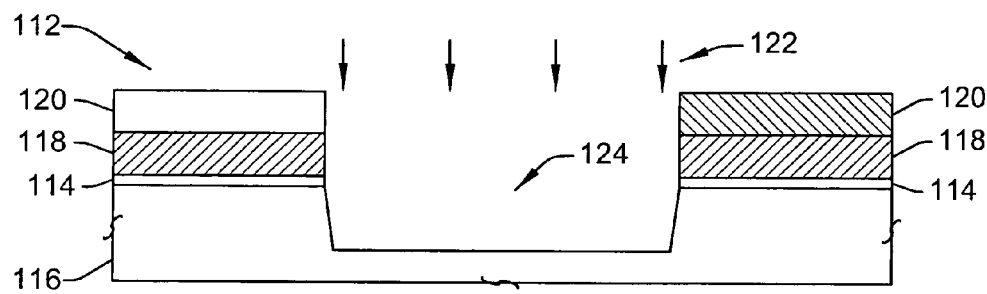
Figure 8B:
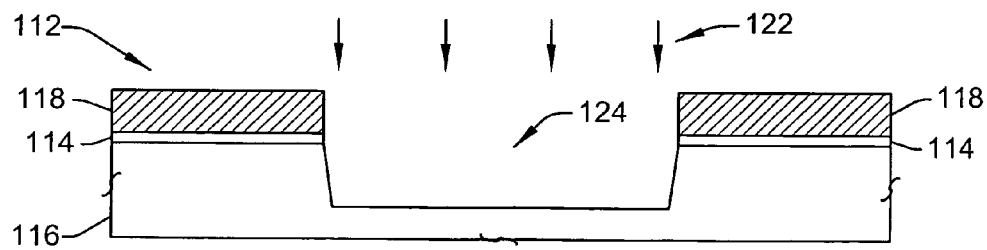
Figure 9:
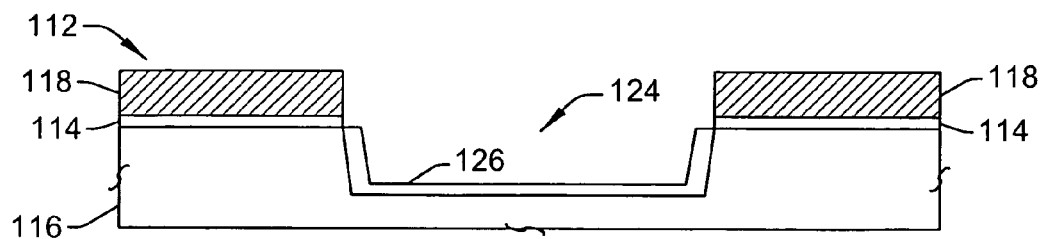

The present invention will now be described with reference to the attached drawings, wherein like reference numerals are used to refer to like elements throughout. The invention relates to methods for forming isolation structures and trenches in semiconductor devices, in which the negative impacts of the INWE are eliminated or substantially mitigated without the addition of extra mask steps. In addition, the method according to one exemplary aspect of the invention advantageously operates to improve a balance or minimize an imbalance of the threshold voltage performance of NMOS and PMOS transistors.

In order to fully appreciate the various aspects of the present invention, a brief description of a conventional STI fabrication process will be discussed. After a discussion thereof, the various aspects of the present invention will be disclosed and fully appreciated. In the fabrication of semiconductor devices, isolation structures are formed between active areas in which electrical devices such as transistors, memory cells, or the like, are to be formed. The isolation structures, in this case shallow trench isolation (STI) structures, are typically formed during initial processing of a semiconductor substrate, prior to the formation of such electrical devices.

STI isolation techniques involve the formation of shallow trenches in the isolation areas or regions of a semiconductor wafer, which are subsequently filled with dielectric material such as silicon dioxide ($SiO_2$) to provide electrical isolation between devices subsequently formed in the active regions on either side of the filled trenches. A pad oxide layer and a nitride layer are typically formed over the substrate surface and patterned to expose only the isolation regions, with the prospective active device regions covered. The nitride layer operates as a hard mask during subsequent processing steps, and the pad oxide layer functions to relieve stress between the underlying silicon substrate and the nitride layer. An anisotropic (e.g., "dry") etch is then performed to form a trench through the nitride, pad oxide, and substrate. Once the trench is etched, dielectric material is deposited to fill the trench with oxide. Thereafter, the device is commonly planarized using a chemical mechanical polishing (CMP) process and the nitride protection layer is removed.

A conventional STI process is illustrated in prior art FIGS. 6–12 to form trench isolation structures in a semiconductor device 112. In prior art FIG. 6, a thermal oxidation process is used to grow a pad oxide layer 114 over a semiconductor body 116. A nitride layer 118, such as $Si_3N_4$, is then deposited in prior art FIG. 7, such as by low-pressure chemical vapor deposition (LPCVD). The nitride layer 118 is used to protect the active regions of the semiconductor body (e.g., the substrate) 116 from adverse effects of the subsequent formation of isolation trenches between the active regions. The active regions of the device 112 are then masked in prior art FIG. 8A using a patterned etch mask 120 (e.g., a resist), leaving the isolation region of the nitride layer 118 exposed. In one conventional photoresist mask process, a dry etch 122 is performed to form a trench 124 through the nitride layer 118, the pad oxide layer 114, and into the body region 116 using the photoresist 120 as the etch mask. Alternatively, as illustrated in prior art FIG. 8B, a hard mask process is performed, wherein the photoresist 120 is removed after patterning the hard mask 118. The patterned hard mask is then used as the mask for patterning the trench 124. As illustrated in prior art FIG. 9, an oxide liner 126 is optionally formed in the trench 124 to remove or repair substrate damage caused by the trench etch process 122.

Figure 10:
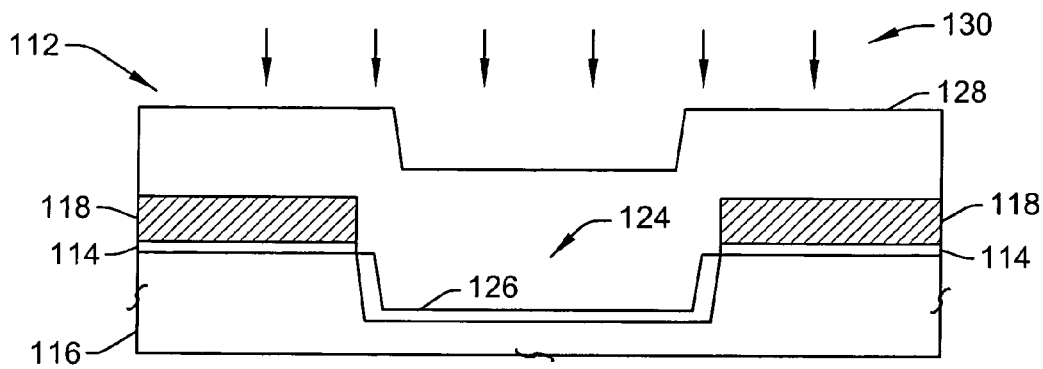
Figure 11:
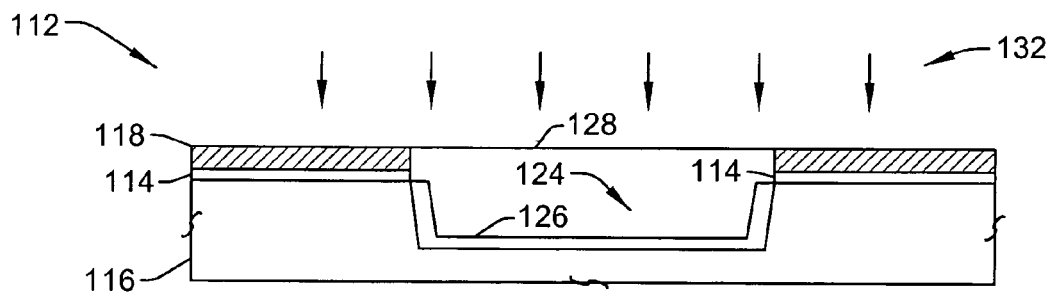
Figure 12:
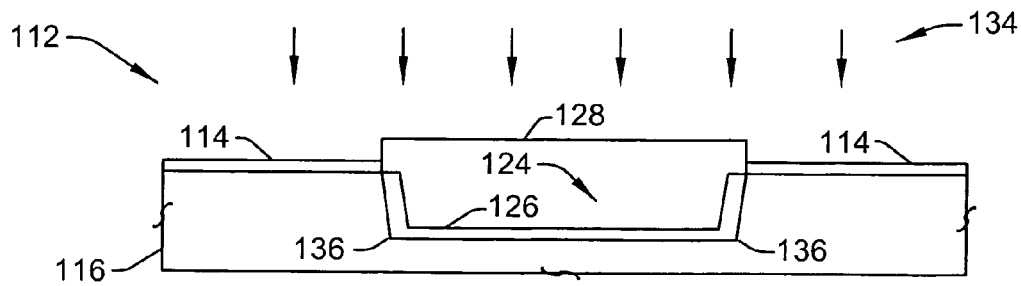

Once the trench 124 and the liner 126 are formed, a dielectric material 128 is deposited in prior art FIG. 10 via a deposition process 130 to fill the trench 124 and also to cover the nitride layer 118 in the active regions of the device 112. In prior art FIG. 11, a chemical mechanical polishing (CMP) or other planarization process 132 is used to planarize the upper surface of the device 112, which exposes the remainder of the nitride layer 118. Following planarization, the nitride layer 118 is removed via an etch process 134 in prior art FIG. 12 to complete the isolation process, leaving the STI structure 128 in the trench 124.

Figure 13:
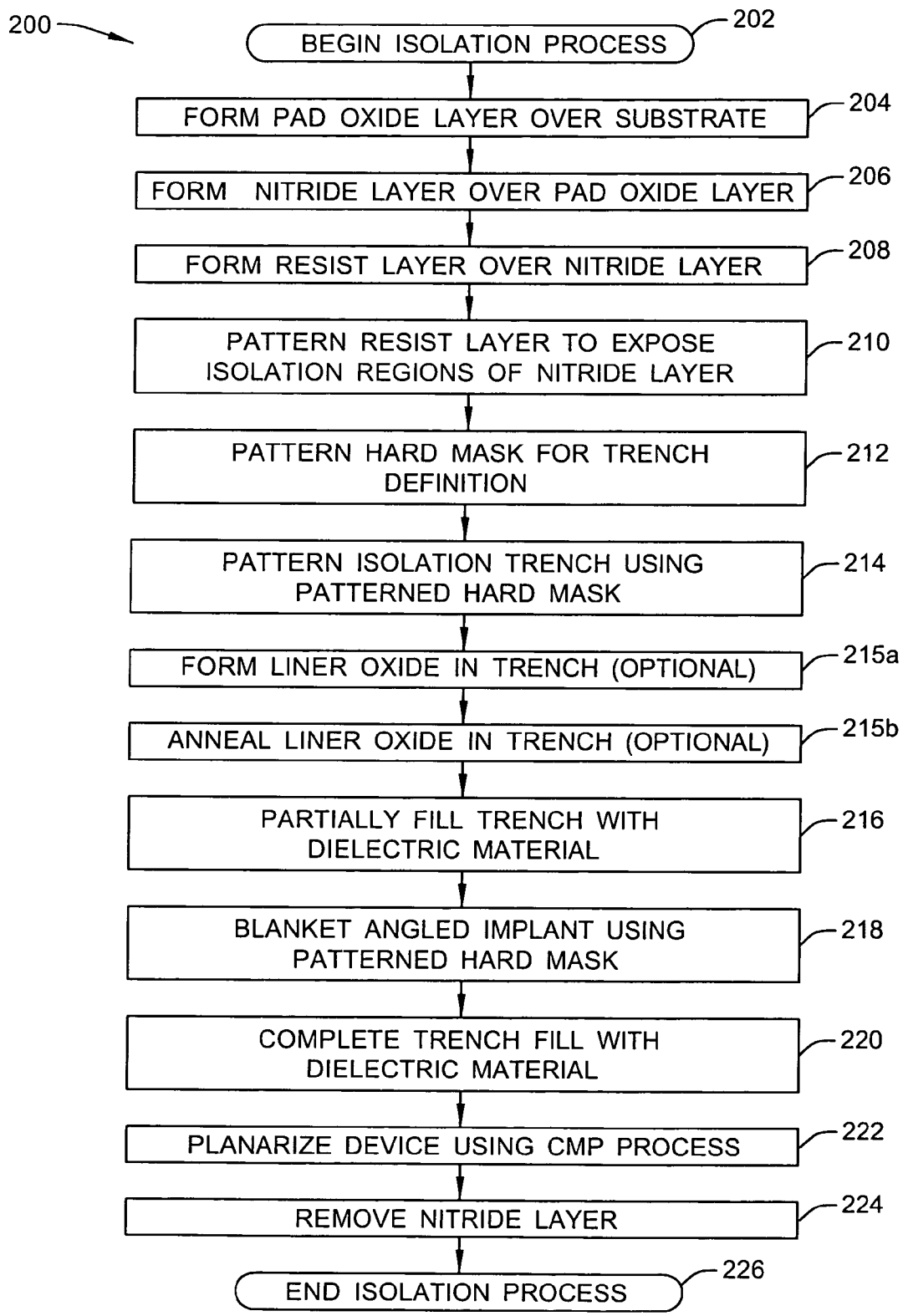
FIG. 13 is a flow chart diagram illustrating an exemplary method of forming an isolation trench in accordance with an aspect of the present invention, wherein an implant masking material comprises a resultant first portion of an trench oxide deposition process.

Referring now to FIG. 13, an exemplary method 200 is illustrated and described for forming an isolation structure in a semiconductor device in accordance with one or more aspects of the invention. While the method 200, and other methods according to the invention, are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the present invention.

Beginning at 202, a pad oxide layer is formed over a semiconductor body such as the substrate at 204 and a nitride layer is formed over the pad oxide layer at 206. The pad oxide layer may be formed at 204 using any appropriate oxidation process, such as a thermal oxidation growth or a deposition process. The pad oxide layer may function to relieve stress between the underlying silicon substrate and the overlying nitride layer formed at 206, and/or to serve as an etch stop when removing the nitride layer later in the process, wherein the nitride layer operates as a hard mask in subsequent isolation processing, for example, to protect the underlying active regions of the substrate. The nitride layer may be formed at 206 using any appropriate deposition techniques and materials, such as $Si_3N_4$ deposited by low pressure chemical vapor deposition (LPCVD).

A resist layer is formed at 208 over the nitride layer, and patterned at 210 to form a patterned mask at 212 exposing isolation regions associated with the semiconductor body, while covering active regions thereof. The patterning of the resist mask at 210 may be accomplished according to known photolithography methodologies, such as by exposing select portions of the resist to a radiation source through a photomask, and removing either the exposed or the unexposed portions of the resist material (depending on the resist type) so as to uncover a portion of the nitride layer in the isolation regions and to leave the active regions covered with the nitride layer. The patterning of the nitride hard mask at 212 is performed, for example, with an anisotropic, dry etch to form isolation openings over the semiconductor body, wherein the openings are associated with the isolation regions. Following patterning of the nitride hard mask at 212, the patterned resist may be removed, for example, by ashing.

Still referring to FIG. 13, at 214 an isolation trench is patterned, for example, by dry etching using the patterned resist mask or the patterned nitride hard mask formed at 212 (if the resist mask is removed after the hard mask patterning). The trench etch 214 may be carried out using known trench etching techniques such as reactive ion etching (RIE).

For example, a single or multi-step RIE etch process may be performed which removes material in the exposed isolation regions so as to etch through any remaining nitride or oxide associated with the hard mask and pad oxide, and etch into the semiconductor substrate so as to form a trench having sidewalls, and a bottom. The width of the insulation trench is associated with the isolation opening(s) in the nitride hard mask. A depth of the isolation trench, in one example, is about 3,000–5,000 Angstroms, however, any trench depth may be employed and is contemplated by the present invention.

The newly formed trench optionally has a liner (e.g., oxide, nitride, oxynitride, nitrided oxides and stacks or combinations thereof) optionally formed therein at 215a followed by an optional anneal thereof at 215b, and is then partially filled with an implant masking material at 216. For example, implant masking material may fill between about 500–1000 Angstroms of the bottom portion of the trench. In one aspect of the present invention, the implant masking material is an oxide that is deposited in the trench using a high-density plasma (HDP) oxide deposition process. The HDP oxide deposition process advantageously fills the trench from the bottom upwards due to a sputtering component associated therewith. As oxide begins to form in the bottom and on sidewalls of the trench, the sputtering component tends to dislodge some of the oxide on the trench sidewalls such that the build-up of oxide on the sidewalls occurs at a substantially slower rate than in the bottom of the trench. Consequently, the HDP oxide deposition process is not generally conformal, which advantageously allows the trench to be filled with dielectric material without the formation of gaps, etc. The HDP process is discontinued after partially filling the trench, thereby leaving a bottom portion of the trench filled with oxide while the sidewalls associated with a top portion of the trench have relatively little oxide thereon.

According to an alternative aspect of the present invention, the trench may be partially filled with an implant masking material by substantially completely filling the isolation trench with an oxide using, for example, the HDP oxide deposition process, or other processes such as, for example, low pressure chemical vapor deposition (LPCVD) employing a tetraethylorthosilicate (TEOS) gas, or plasma enhanced chemical vapor deposition (PECVD) of silicon dioxide from TEOS and oxygen mixtures (PETEOS). After the trench is completely or substantially completely filled, an etch-back process is employed wherein oxide is removed from a top portion of the trench, while the oxide in the bottom portion of the trench remains therein.

A blanket angled implant is then performed at 218. The dopant associated with the angled implant goes into the isolation trench. The dopant that impacts a top sidewall portion of the trench passes through the relatively thin oxide thereat, and enters the semiconductor body, while the dopant that strikes the oxide in the bottom portion of the isolation trench is blocked substantially from entering the semiconductor material along a bottom and bottom sidewall portion thereof. Consequently, the angled implant results in the formation of a threshold voltage compensation region in the semiconductor body along a top sidewall portion of the trench. As will be discussed in greater detail infra, the compensation region operates to adjust a threshold voltage of a transistor formed in an active region containing the compensation region next to the isolation structure.

In one example of the present invention, the angled implant is a quad angled implant, wherein a total implant dose is divided into four implants, wherein each implant is performed at substantially the same angle with the wafer being rotated 90 degrees after each implant. Alternatively, other type angled implants may be employed and are contemplated as falling within the scope of the present invention.

The angle associated with the implant may vary depending on a thickness of the nitride hard mask and an amount of implant masking material overlying the nitride hard mask. In one example, with an aspect ratio of the isolation opening being about 1:1, the angle of the implant will be less than 45 degrees. However, as may be appreciated, for differing aspect ratios, the angle may be increased or decreased appropriately to ensure dopant is implanted into the semiconductor body along the top sidewall of the trench.

As may be appreciated, the implant energy of the angled implant may vary depending on a desired size of the compensation region and an estimated thickness of implant masking or blocking material on the upper sidewalls of the isolation trench. For example, with little to no implant masking or blocking material present on the upper trench sidewalls, the implant energy employed to implant dopant about 250–500 Angstroms into the semiconductor body will vary depending on the dopant employed. For example, an implant energy for boron may be about 8 keV–20 keV, an implant energy for arsenic may be about 50 keV–100 keV, and an implant energy for phosphorous may be about 20 keV–60 keV. In order to implant to a similar depth with a moderate amount of implant masking or blocking material on the upper trench sidewalls, such implant energies would be increased by an amount depending on a thickness of the remaining implant blocking material, as may be appreciated.

In one preferred aspect of the present invention, the semiconductor body is of a first conductivity type (e.g., a p-type material such as boron) and the angled implant comprises a dopant of a second, different conductivity type (e.g., an n-type material). Further, when employing an n-type implant dopant, the use of arsenic (As) is preferred. While any n-type dopant may be employed and is contemplated by the present invention, the n-type dopant preferably is As since As tends to diffuse less than phosphorous.

Still referring to FIG. 13, at 220 the remaining portion of the trench is filled with the dielectric material such as $SiO_2$ or other electrically isolating material. In one example, the HDP oxide deposition process may be re-initiated to fill the rest of the trench. Alternatively, other dielectric deposition processes may be employed and are contemplated by the present invention. Note that due to the sputtering component of the HDP oxide process, some of the underlying hard mask layer may be impacted.

The device is then planarized at 222 to expose a portion of the remaining nitride hard mask layer in the active regions, leaving a generally planar upper surface with portions of the nitride layer and a remaining portion of the fill material in the trench exposed. The remaining nitride material is stripped or removed at 224, for example, using a selective wet etch process so as to remove nitride material and to stop on the pad oxide layer without damaging the underlying silicon or other semiconductor material in the active regions of the device. The isolation method 200 then ends at 226. Thereafter, transistors, memory cells, and/or other electrical devices may be formed in the active regions using semiconductor processing techniques, as are known.

During such formation of transistors in the active regions, the compensation regions formed along top sidewall portions of the isolation trenches serve to alter an impact of the inverse narrow width effect (INWE) by providing the compensation dopant to account for or adjust dopant loss to the STI trench. For example, in the PMOS regions, an n-type compensation region adds to subsequently added n-type dopant in the PMOS active regions (e.g., due to formation of an N-well therein); and consequently any dopant loss from the region close to the STI trench is compensated by the compensation regions so that the n-type dopant in the PMOS active region is more uniform. Accordingly, the threshold voltage of the resulting PMOS transistors increases despite the INWE effect. Consequently, the PMOS threshold voltages for narrow width devices may be increased, for example by about 10%. In one example, the threshold voltage was increased from about negative 0.3V to about negative 0.33V.

Conversely, in the NMOS regions, the n-type compensation regions provide for a net reduction in the charge associated with the p-type dopant in the NMOS regions (e.g., due to the p-type substrate or due to a p-type well region), thus causing a dopant loss to the STI trench to be exaggerated or increased. Thus the NMOS regions will experience increased dopant loss, thereby causing a decrease in the threshold voltage of NMOS transistors therein. In one example, the NMOS threshold voltages were decreased about 10%, from about 0.5V to about 0.45V. In the above manner, "cold" transistors are made more "warm", and "hot" transistors are made more "cool", such that the threshold voltage differences between the PMOS and NMOS devices may be decreased. Therefore the present invention provides another control knob for altering the threshold voltage of NMOS and PMOS transistors without an additional mask step.

While in the above example, an n-type dopant such as arsenic is employed in the implant to alter the threshold voltages as described, alternatively, the compensation implant may comprise a p-type dopant, wherein such dopant serves to adjust the threshold voltages of the PMOS and NMOS devices in the opposite direction. Such alternatives are contemplated as falling within the scope of the present invention.

Referring now to FIGS. 14–23, one exemplary implementation of the techniques provided by the exemplary method 200 of FIG. 13 is illustrated, wherein a semiconductor wafer or device 302 is processed to form isolation structures therein. It is noted at this point that the illustrations provided herein are not necessarily drawn to scale, and that the above method 200 may be employed in processing structures other than those illustrated in the following figures, and further that the structures illustrated and described herein may be fabricated according to other techniques.

Figure 14:
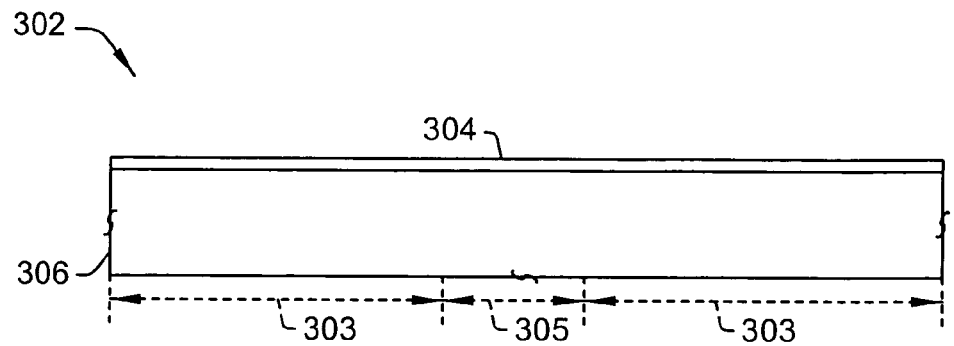
FIGS. 14 is a partial side elevation view in section illustrating a pad oxide layer being formed over a semiconductor body in the fabrication of a trench isolation structure according to the invention.
Figure 15:
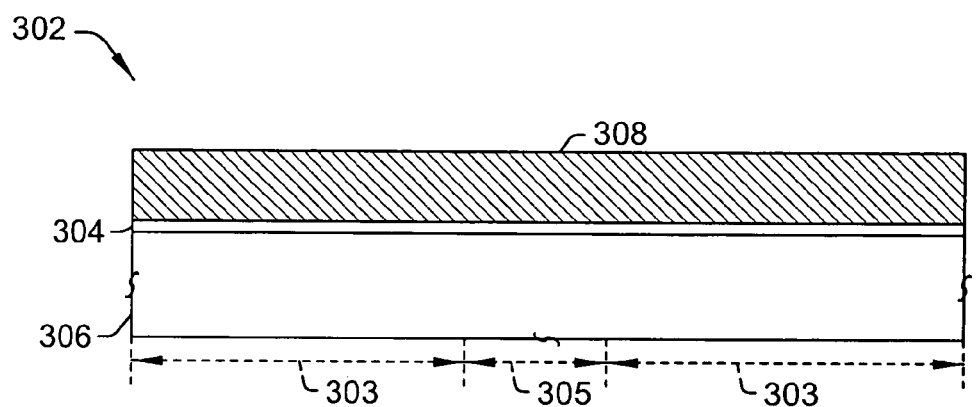
FIG. 15 is a partial side elevation view in section illustrating formation of a nitride hard mask layer over the pad oxide layer of FIG. 14.

In FIG. 14, the wafer 302 is illustrated comprising a semiconductor body (e.g., a substrate) 306, such as silicon having prospective active regions 303 (e.g., PMOS or NMOS regions) in which electrical devices are to be subsequently fabricated, as well as a prospective isolation region 305 in which an isolation structure is to be formed to isolate the active regions 303 from one another. An oxidation process (not shown) is initially employed to grow a pad oxide layer 304 over the top surface of the substrate 306 as illustrated in FIG. 14. A nitride hard mask layer 308 is then deposited in FIG. 15, such as by low pressure chemical vapor deposition (LPCVD) of $Si_3N_4$ or equivalent nitride or equivalent material.

Figure 16:
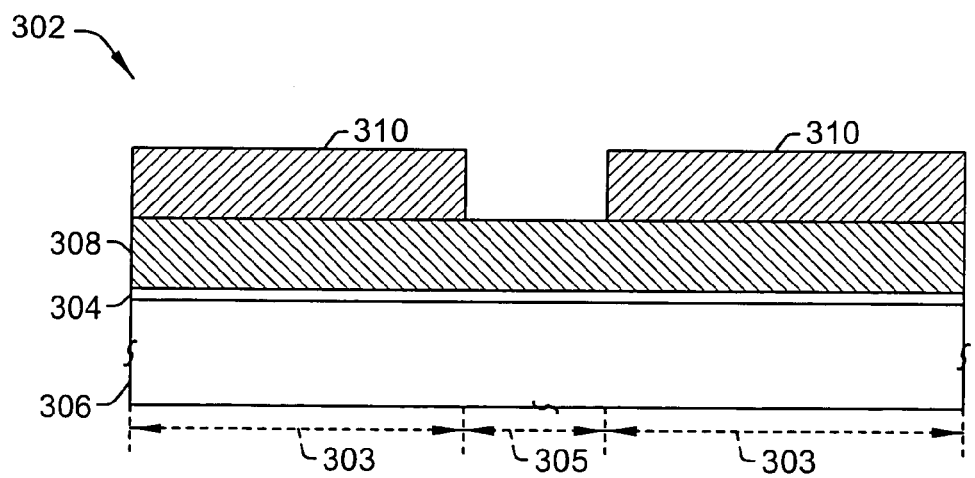
FIG. 16 is a partial side elevation view in section illustrating a patterned resist mask formed over the nitride hard mask layer to define an isolation region in the device of FIGS. 14 and 15.

Thereafter, in FIG. 16, a patterned mask 310 (e.g., a developed photoresist) is formed to cover the active regions 303 while exposing the nitride hard mask layer 308 in the isolation region 305 for subsequent trench formation therein. A dry etch process 312a is employed in FIG. 17, in one example, to etch through the nitride hard mask layer 308 and at least a portion of the pad oxide layer 304 to substantially expose the semiconductor body 306 associated with the isolation region 305.

Figure 17:
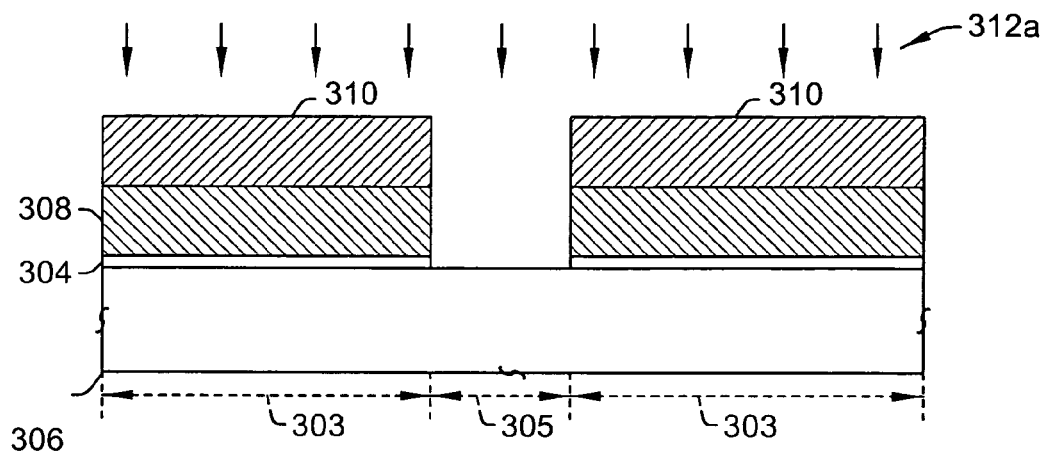
FIG. 17 is a partial side elevation view in section illustrating a dry etch process for patterning all or a portion of the nitride hard mask using the patterned resist mask to form an isolation opening associated with the isolation region in the semiconductor body.
Figure 18A:
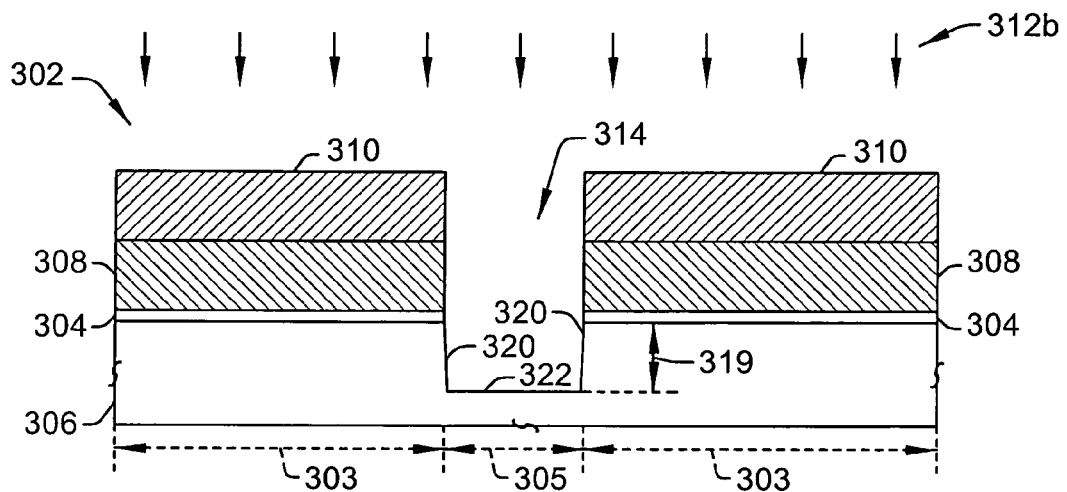
FIGS. 18A and 18B are partial side elevation views in section illustrating a dry etch process for patterning an isolation trench in the isolation region of the semiconductor body using the patterned resist mask and the patterned nitride hard mask, respectively.
Figure 18B:
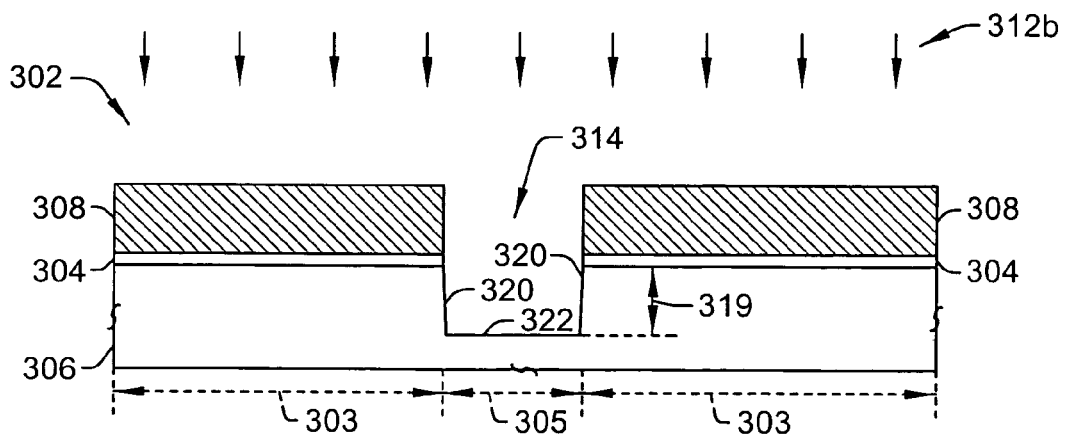

Continuing with respect to FIG. 18, a trench etch is performed, wherein an etch process 312b is performed using the same isolation mask 308 to form an isolation trench 314 to a depth 319 in the isolation region 305, where the trench comprises sidewalls 320 and a bottom 322. For example, the depth may be about 3,000–5,000 Angstroms. In one example, the resist mask 310 of FIG. 17 is removed prior to the etch 312b (e.g., via an ash), while in another example, the resist mask 310 remains on the nitride hard mask during the trench etch.

Figure 19:
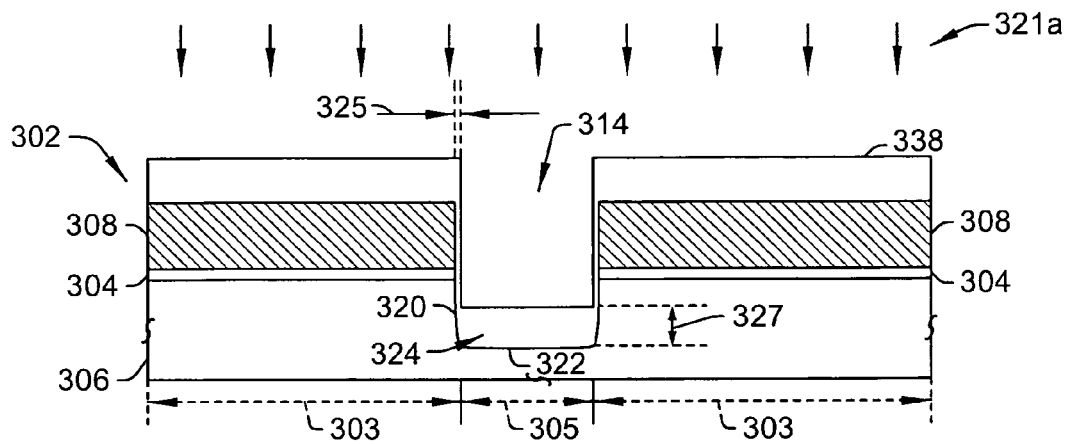
FIG. 19 is a partial side elevation view in section illustrating a formation of an implant masking material in a bottom portion of the isolation trench in the device of FIG. 18.

As illustrated in FIG. 19, after trench formation a partial filling of the trench 314 is performed with an implant masking or blocking material 338. In one example, the material comprises an oxide that comprises a first stage of the trench fill process. For example, an HDP oxide deposition process 321a is performed, wherein the oxide material 338 forms on a top surface of the nitride hard mask 308 and in a bottom portion 324 of the trench 314. Note that a thickness 325 of the material 338 on sides 320 of the trench is relatively thin compared to a thickness 327 (e.g., about 500–1,000 Angstroms) in the bottom of the trench, as illustrated. This variation is caused by the HDP oxide deposition process that has a sputtering component associated therewith, wherein during deposition the sputter of oxide on the trench sidewalls 320 substantially reduces a rate of deposition thereon compared to the bottom of the trench.

Alternatively, the trench may be filled in a partial manner by filling the trench with dielectric material and then performing an etch-back process, as may be desired.

Figure 20:
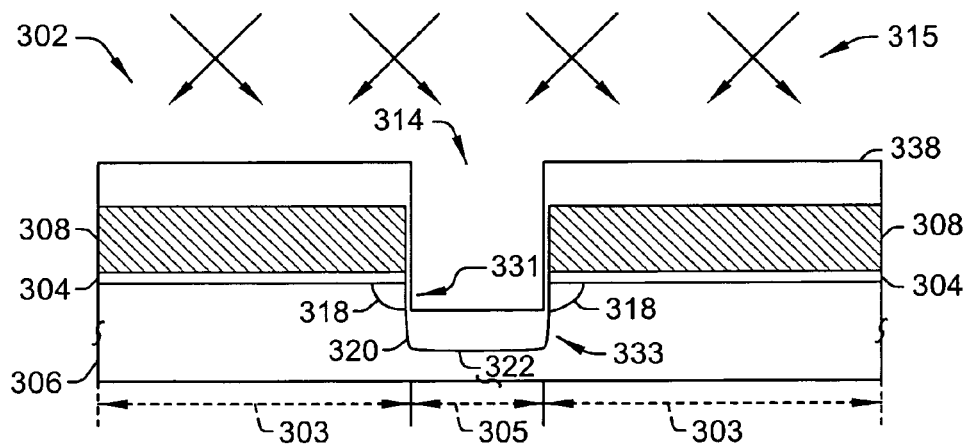
FIG. 20 is a partial side elevation view in section illustrating an angled implant into the isolation region to form a threshold voltage compensation region in the semiconductor body along an upper sidewall portion of the isolation trench, wherein the implant masking material blocks dopant from entering the semiconductor body along a bottom and bottom sidewall portion of the isolation trench.

Turning now to FIG. 20, an angled implant 315 is performed, wherein the angled implant forms threshold voltage compensation regions 318 in the semiconductor body 306 along an upper sidewall portion 331 of the trench 314, as illustrated. Note that the implant masking material (dielectric 338 in this example) in the bottom of the trench substantially prevents the dopant from the angled implant 315 from entering the semiconductor body 306 along a bottom 322 and bottom sidewall portions 333 of the trench. By preventing the compensation regions 318 from extending around and below the trench 314, potential leakage from such a region is advantageously avoided. In one example, an n-type dopant such as arsenic is employed for the angled implant 315, wherein such dopant acts to reduce an imbalance in threshold voltages between PMOS and NMOS transistors. Alternatively, the angled implant may be performed with a p-type dopant, wherein the threshold voltages of resulting devices are still adjusted, however, the adjustments move in opposite directions.

Figure 21:
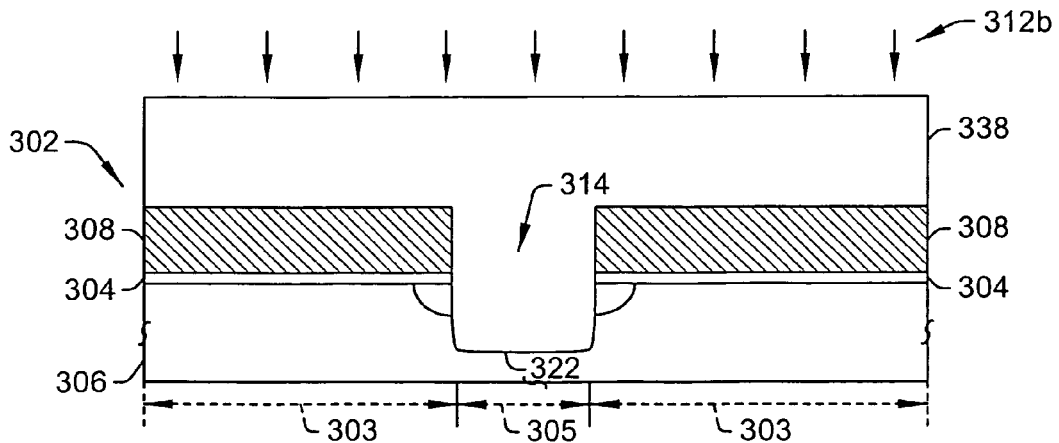
FIG. 21 is a partial side elevation view in section illustrating deposition of dielectric trench fill material into the trench and over the upper portions of the device of FIG. 20.

The trench 314 is then completely filled with a dielectric fill process 312b, as illustrated in FIG. 21. In one example, the process 312b comprises a re-initiation of the HDP oxide deposition process, wherein oxide fills the remainder of the trench. Alternatively, however, any dielectric material and dielectric deposition process may be employed and is contemplated as falling within the scope of the present invention.

Figure 22:
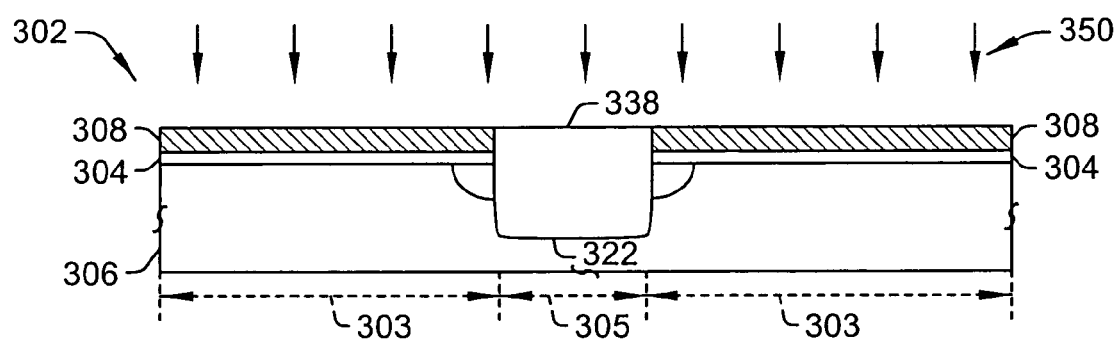
FIG. 22 is a partial side elevation view in section illustrating planarization of the device of FIG. 21 using a CMP process.
Figure 23:
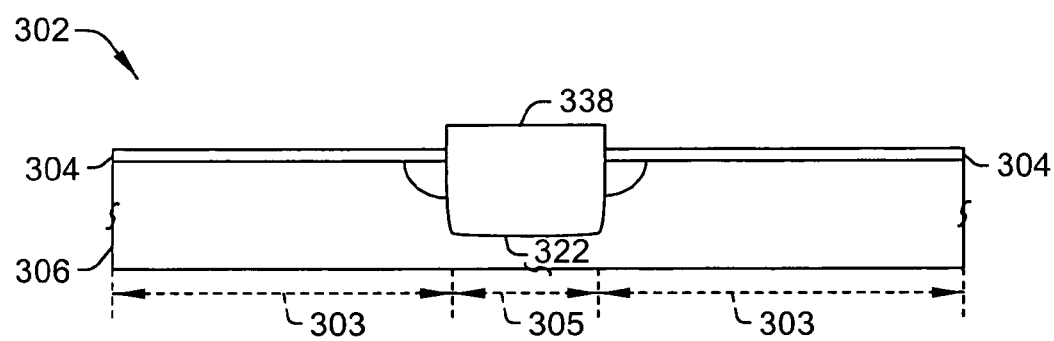
FIG. 23 is a partial side elevation view in section illustrating removal of the nitride hard mask layer from the device of FIG. 22.

Thereafter in FIG. 22, a planarization process 350 is performed to remove the upper portions of the fill material 338 as well as upper portions of the nitride hard mask layer 308, wherein the nitride layer 308 serves as a planarization stop. The process 350 preferably comprises a chemical-mechanical polishing (CMP) process wherein a generally planar upper surface is provided in the device 302. Subsequently in FIG. 23, the remainder of the nitride layer material 308 is stripped or otherwise removed, leaving a finished STI isolation structure comprising the trench 314 filled with dielectric material 338 surrounded by threshold voltage compensation regions 318 along upper sidewall portions of the trench. Thereafter, transistors, memory cells, and/or other electrical devices (not shown) may be formed in the active regions using semiconductor processing techniques, as are known.

In the device of FIGS. 14–23, an angled implant is performed after the formation of an implant masking material in the bottom portion of the trench, resulting in the formation of threshold voltage compensation regions associated with top sidewall portions of isolation regions in the semiconductor body. Subsequent to the implant, the trench is filled with a dielectric material to complete the isolation structures. As described herein, in one aspect of the invention, the compensation regions along the top sidewall portions of the trench are employed to alter the threshold voltages of NMOS and PMOS transistors in a semiconductor device. In addition, the compensation regions are obtained without requiring an additional mask.

Figure 24:
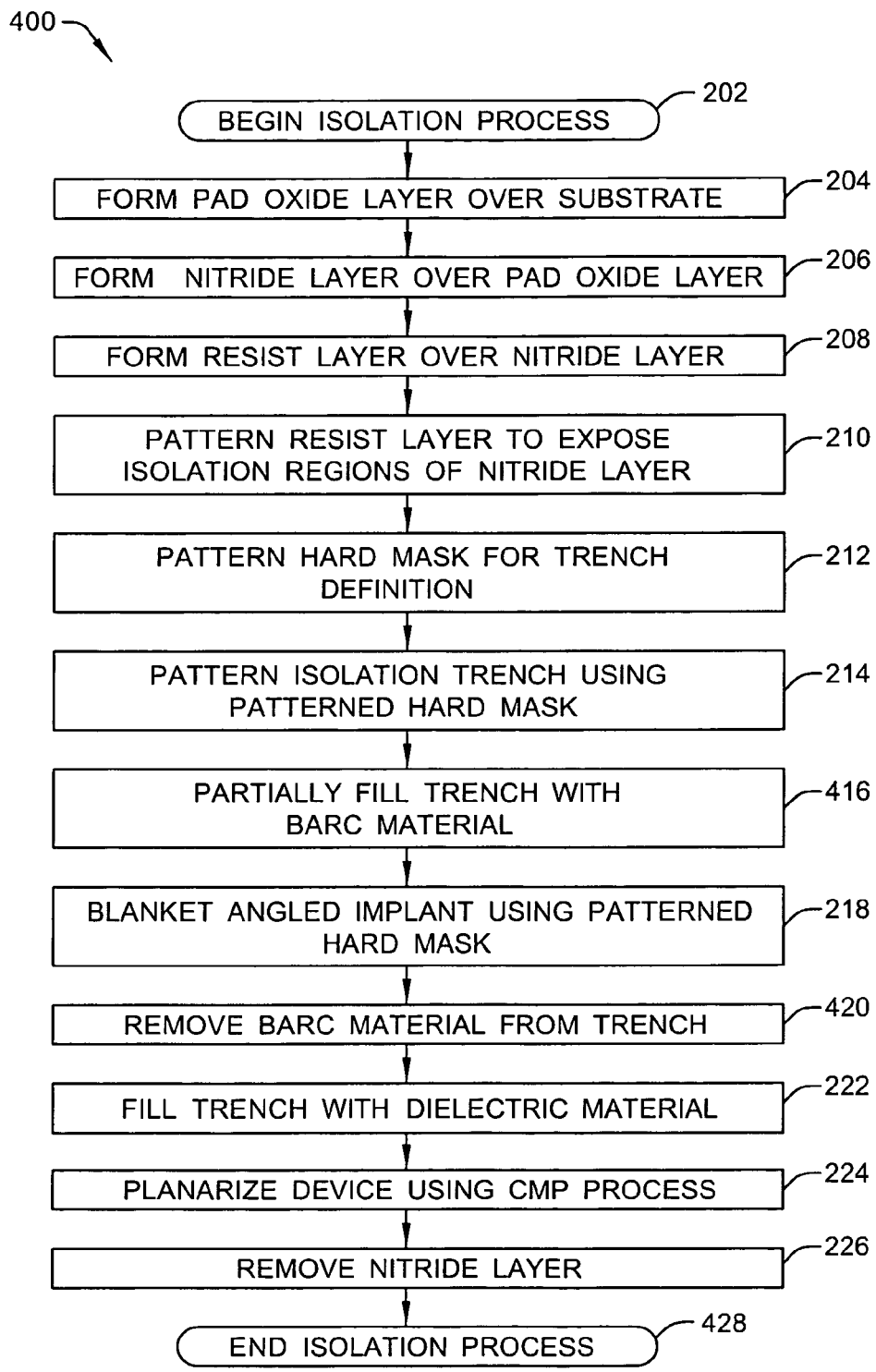
FIG. 24 is a flow chart diagram illustrating an exemplary method of forming an isolation trench in accordance with an aspect of the present invention, wherein an implant masking material comprises an organic BARC material.

Although FIGS. 14–23 illustrate the formation of the implant masking material as a first stage oxide deposition for trench fill, followed by filling the remaining portion of the trench after an angled implant, other implant masking materials may be used in accordance with the present invention. For example, FIG. 24 is a flow chart illustrating a method 400 of forming an isolation structure using a different type of implant masking material. Acts 202–214 may proceed in a manner similar to that discussed above and as illustrated in FIGS. 14–18. Then at 416 an implant masking material such as an organic barrier antireflective coating (BARC) material may be applied, for example, via spin coating, to flow within the trench to a thickness of about 1,000 Angstroms, for example. In one example, such BARC material application partially fills the isolation trench or trenches, thereby leaving top sidewall portions thereof generally exposed. Alternatively, the BARC material application may fill the trench and be baked, followed by an etch-back, wherein a portion of the BARC material is removed from a top portion of the trench.

Still referring to FIG. 24, once the BARC material resides in a bottom portion of the trench, the angled implant is performed at 218. Afterwards, the BARC material is removed from the trench bottom at 420 via, for example, by an ashing process, followed by a wet clean, however, other removal processes may be employed and are contemplated by the present invention. The empty trench is then filled with a dielectric material and planarized, and the nitride hard mask is removed at acts 222–226, wherein the isolation process 400 ends at 428. Although an organic BARC material is discussed above as an exemplary implant masking material, any flowable material such as flowable silicon oxide (such as HSQ), or organic polymer material that serves to block dopant from entering the semiconductor body at the bottom and bottom sidewall portions of the trench may be employed and is contemplated by the present invention.

Although the invention has been illustrated and described with respect to one or more implementations, equivalent alterations and modifications will occur to others skilled in the art upon the reading and understanding of this specification and the annexed drawings. In particular regard to the various functions performed by the above described components (assemblies, devices, circuits, systems, etc.), the terms (including a reference to a "means") used to describe such components are intended to correspond, unless otherwise indicated, to any component which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising."

What is claimed is:

1. A method of forming an isolation structure, comprising:
    forming an isolation trench in a semiconductor body associated with an isolation region;
    filling a bottom portion of the isolation trench substantially more than a top portion thereof with an implant masking material comprising a dielectric material;
    performing an angled ion implant into the isolation trench after having the bottom portion thereof filled with the implant masking material, thereby forming a threshold voltage compensation region in the semiconductor body; and
    filling the isolation trench with a dielectric material after performing the angled ion implant.

2. The method of claim 1, wherein the semiconductor body comprises a first conductivity type and a dopant associated with the angled ion implant comprises a second, different conductivity type.

3. The method of claim 1, wherein the angled implant results in the threshold voltage compensation region formed in the semiconductor body along a top sidewall portion of the trench, wherein the implant masking material substantially blocks dopant from entering the semiconductor body along a bottom and a bottom sidewall portion of the isolation trench.

4. A method of forming an isolation structure, comprising:
    forming an isolation trench in a semiconductor body associated with an isolation region;
    filling a bottom portion of the isolation trench with an implant masking material comprising a dielectric material;
    performing an angled ion implant into the isolation trench after having the bottom portion thereof filled with the implant masking material, thereby forming a threshold voltage compensation region in the semiconductor body; and
    filling the isolation trench with a dielectric material after performing the angled ion implant,
    wherein filling the bottom portion of the isolation trench with the dielectric material comprises performing a high density plasma oxide deposition process, wherein an oxide deposits on a bottom of the isolation trench at a substantially greater rate than on a sidewall thereof.

5. The method of claim 4, wherein filling the isolation trench with the dielectric material comprises re-initiating the high density plasma oxide deposition process after the angled implant, thereby filling a remaining portion of the isolation trench with the oxide.

6. The method of claim 1, wherein forming the isolation trench comprises:
    forming a hard mask layer over the semiconductor body;

forming a patterned photoresist over the hard mask layer, the patterned photoresist having an opening therein associated with the isolation region;

patterning the hard mask layer using the patterned photoresist; and patterning the semiconductor body after patterning the hard mask layer, thereby forming the isolation trench in the semiconductor body.

7. The method of claim 6, wherein patterning the semiconductor body comprises:

removing the patterned photoresist; and patterning the semiconductor body using the patterned hard mask as an etch mask.

8. A method of forming an isolation structure, comprising:

forming an isolation trench in a semiconductor body associated with an isolation region;

forming a trench liner in the isolation trench;

annealing the trench liner prior to performing the angled ion implant;

filling a bottom portion of the isolation trench with an implant masking material;

performing an angled ion implant into the isolation trench after having the bottom portion thereof filled with the implant masking material, thereby forming a threshold voltage compensation region in the semiconductor body; and filling the isolation trench with a dielectric material after performing the angled ion implant.

9. The method of claim 8, wherein the trench liner comprises one or more of an oxide, a nitride, a nitrided oxide, and an oxynitride.

10. The method of claim 6, wherein patterning the semiconductor body comprises patterning the semiconductor body using the patterned photoresist as an etch mask.

11. A method of forming an isolation structure, comprising:

forming an isolation hard mask layer over a semiconductor body;

patterning a portion of the isolation hard mask layer, thereby defining an isolation region in the semiconductor body having a width associated therewith;

patterning the semiconductor body using the patterned isolation hard mask layer, thereby forming an isolation trench in the semiconductor body having a depth associated therewith;

filling a bottom portion of the isolation trench substantially more than a top portion thereof with an implant masking material comprising a dielectric material;

performing an angled implant with a dopant into the isolation region using the patterned isolation hard mask after filling the bottom portion of the isolation trench with the implant masking material, thereby forming a threshold voltage compensation region in the semiconductor body along a sidewall of the trench, the compensation region having a depth less than the trench depth; and filling the isolation trench with a dielectric material.

12. The method of claim 11, wherein the semiconductor body comprises a first conductivity type, and the angled implant is performed with a dopant of a second, different conductivity type.

13. The method of claim 12, wherein the semiconductor body comprises a p-type material, and the implant dopant comprises arsenic.

14. The method of claim 11, wherein forming the isolation hard mask comprises:

forming a pad oxide layer over the semiconductor body; and forming a nitride hard mask layer over the pad oxide layer.

15. The method of claim 14, wherein patterning the isolation hard mask comprises:

forming a resist over the nitride hard mask layer;

patterning the resist to expose a portion of the nitride hard mask layer corresponding to the isolation region;

etching the nitride hard mask corresponding to the isolation region using the patterned resist as an etch mask; and removing the patterned resist.

16. The method of claim 11, wherein filling the bottom portion of the trench with the dielectric material comprises performing a high density plasma oxide deposition, wherein the high density plasma oxide deposition process has a sputtering component associated therewith causing a deposition of oxide on sidewalls of the isolation trench to be substantially less than the oxide deposition at a bottom of the isolation trench, thereby facilitating a filling of the isolation trench with oxide from the bottom thereof.

17. The method of claim 16, wherein filling the isolation trench with the dielectric material comprises re-initiating the high density plasma oxide deposition process after the angled implant to complete a filling of a remainder of the isolation trench with oxide.

18. The method of claim 11, wherein filling the bottom portion of the trench with an implant masking material comprises:

filling the isolation trench with the dielectric material; and etching back a portion of the dielectric material in the isolation trench, thereby leaving a portion of the dielectric material at the bottom of the isolation trench.

19. A method of forming an isolation structure, comprising:

forming an isolation hard mask layer over a semiconductor body;

patterning a portion of the isolation hard mask layer, thereby defining an isolation region in the semiconductor body having a width associated therewith;

patterning the semiconductor body using the patterned isolation hard mask layer, thereby forming an isolation trench in the semiconductor body having a depth associated therewith;

forming a trench liner in the isolation trench;

annealing the trench liner prior to performing the angled ion implant;

filling a bottom portion of the isolation trench with an implant masking material;

performing an angled implant with a dopant into the isolation region using the patterned isolation hard mask after filling the bottom portion of the isolation trench with the implant masking material, thereby forming a threshold voltage compensation region in the semiconductor body along a sidewall of the trench, the compensation region having a death less than the trench depth; and filling the isolation trench with a dielectric material.

20. The method of claim 19, wherein the trench liner comprises one or more of an oxide, a nitride, a nitrided oxide, and an oxynitride.

21. A method of forming an isolation structure in a CMOS device, comprising:

forming an isolation hard mask layer over an NMOS region and a PMOS region of a semiconductor body;

patterning the isolation hard mask layer, thereby defining isolation regions in both the NMOS region and the PMOS region of the semiconductor body;

patterning the semiconductor body using the patterned isolation hard mask, thereby forming isolation trenches in the semiconductor body having a depth associated therewith;

forming a trench liner in the isolation trench;

annealing the trench liner prior to performing an angled ion implant;

filling a bottom portion of the isolation trenches with an implant masking material;

performing the angled ion implant, wherein a dopant associated therewith forms threshold voltage compensation regions in both PMOS and NMOS regions along a top sidewall portion of the isolation trenches, and wherein the implant masking material in the trenches substantially prevents the dopant from entering the semiconductor body along a bottom and bottom sidewall portion of the isolation trenches; and filling the isolation trenches with a dielectric material after the angled implant.

22. The method of claim 21, wherein the trench liner comprises one or more of an oxide, a nitride, a nitrided oxide, and an oxynitride.

* * * * *